US006852242B2

(12) United States Patent
Sun et al.

(10) Patent No.: US 6,852,242 B2
(45) Date of Patent: Feb. 8, 2005

(54) CLEANING OF MULTICOMPOSITIONAL ETCHANT RESIDUES

(76) Inventors: Zhi-Wen Sun, 126 Destry Ct., San Jose, CA (US) 95136; Anbei Jiang, 667 La Grande Dr., Apt. 1, Sunnyvale, CA (US) 94087; Tuo-Chuan Huang, 10474 Scenic Ct., Cupertino, CA (US) 95014

( * ) Notice: Subject to any disclaimer, the term of this patent is extended or adjusted under 35 U.S.C. 154(b) by 139 days.

(21) Appl. No.: 09/792,444

(22) Filed: Feb. 23, 2001

(65) Prior Publication Data

US 2002/0117472 A1 Aug. 29, 2002

(51) Int. Cl.[7] .................................... C03C 15/00

(52) U.S. Cl. .......................... 216/60; 216/67; 216/68; 216/80; 438/719; 438/721

(58) Field of Search .......................... 216/59, 60, 67, 216/68, 80; 438/719, 721, 725

(56) References Cited

U.S. PATENT DOCUMENTS

| | | | |
|---|---|---|---|
| 4,282,267 | A | 8/1981 | Kuyel |
| 4,433,228 | A | 2/1984 | Nishimatsu et al. |
| 4,465,532 | A | 8/1984 | Fukano |
| 4,490,209 | A | 12/1984 | Hartman |
| 4,502,914 | A | 3/1985 | Trumpp et al. |
| 4,529,474 | A | 7/1985 | Fujiyama et al. |
| 4,705,595 | A | 11/1987 | Okudaira et al. |
| 4,738,748 | A | 4/1988 | Kisa |
| 4,786,352 | A | 11/1988 | Benzing |
| 4,818,326 | A | 4/1989 | Liu et al. |
| 4,820,377 | A | 4/1989 | Davis et al. |
| RE32,928 | E | 5/1989 | Jacob |
| 4,831,963 | A | 5/1989 | Saito et al. |
| 4,863,561 | A | 9/1989 | Freeman et al. |
| 4,867,841 | A | 9/1989 | Loewenstein et al. |
| 4,876,212 | A | 10/1989 | Koury |
| 4,975,144 | A | 12/1990 | Yamazaki et al. |
| 4,992,136 | A | 2/1991 | Tachi et al. |
| 5,002,632 | A | 3/1991 | Loewenstein et al. |

(List continued on next page.)

FOREIGN PATENT DOCUMENTS

| | | |
|---|---|---|
| DE | 4132559 | 4/1993 |
| EP | 0272143 | 6/1988 |
| EP | 0314990 | 5/1989 |

(List continued on next page.)

OTHER PUBLICATIONS

PCT Search Report dated Nov. 8, 2000; European Patent Office, P.B. 5818 Patentlaan 2 NL–2280 HV Rijswijk.

Aydil, et al. *Multiple Steady states in a radio frequency chlorine glow discharge*; Sep. 10, 1990; pp. 109–114.

Hillenius, S.J, *A Symmetric Submicron CMOS Technology*; Copyright 1986.

(List continued on next page.)

*Primary Examiner*—Nadine G. Norton
*Assistant Examiner*—Binh X. Tran
(74) *Attorney, Agent, or Firm*—Janah & Associates; Joseph Bach

(57) ABSTRACT

A substrate processing apparatus has a chamber with a substrate transport to transport a substrate onto a substrate support in the chamber, a gas supply to provide a gas in the chamber, a gas energizer to energize the gas, and a gas exhaust to exhaust the gas. A controller operates one or more of the substrate support, gas supply, gas energizer, and gas exhaust, to set etching process conditions in the chamber to etch a plurality of substrates, thereby depositing etchant residues on surfaces in the chamber. The controller also operates one or more of the substrate support, gas supply, gas energizer, and gas exhaust, to set cleaning process conditions in the chamber to clean the etchant residues. The cleaning process conditions comprise a volumetric flow ratio of $O_2$ to $CF_4$ of from about 1:1 to about 1:40.

15 Claims, 6 Drawing Sheets

U.S. PATENT DOCUMENTS 5,013,398 A 5/1991 Long et al.
5,035,768 A 7/1991 Mu et al.
5,084,126 A 1/1992 McKee
5,094,712 A 3/1992 Becker et al.
5,110,408 A 5/1992 Fujii et al.
5,110,411 A 5/1992 Long et al.
5,118,387 A 6/1992 Kadomura
5,158,644 A 10/1992 Cheung et al.
5,160,407 A 11/1992 Latchford et al.
5,164,330 A 11/1992 Davis et al.
5,176,792 A 1/1993 Fullowan et al.
5,188,980 A 2/1993 Lai
5,192,702 A 3/1993 Tseng
5,256,245 A 10/1993 Keller et al.
5,281,302 A 1/1994 Gabric et al.
5,282,899 A 2/1994 Balmashov et al.
5,312,519 A 5/1994 Sakai et al.
5,318,668 A 6/1994 Tamaki et al.
5,338,398 A 8/1994 Szwejkowski et al.
5,354,417 A 10/1994 Cheung et al.
5,356,478 A 10/1994 Chen et al.
5,378,311 A 1/1995 Nagayama et al.
5,382,316 A 1/1995 Hills et al.
5,401,356 A * 3/1995 Enami et al. .................. 438/5
5,413,954 A 5/1995 Aydil et al.
5,417,826 A 5/1995 Blalock
5,443,686 A 8/1995 Jones et al.
5,449,411 A 9/1995 Fukuda et al.
5,514,622 A 5/1996 Bornstein et al.
5,521,119 A 5/1996 Chen et al.
5,620,615 A 4/1997 Keller
5,644,153 A 7/1997 Keller
5,647,953 A 7/1997 Williams et al.
5,700,741 A 12/1997 Liao
5,753,533 A 5/1998 Saito
5,756,400 A 5/1998 Ye et al.
5,767,021 A 6/1998 Imai et al.
5,788,778 A 8/1998 Shang et al.
5,788,799 A 8/1998 Steger et al.
5,817,578 A 10/1998 Ogawa
5,843,239 A 12/1998 Shrotiya
5,846,373 A 12/1998 Pirkle et al.
5,866,483 A 2/1999 Shiau et al.
5,869,401 A 2/1999 Brunemeier et al.
5,874,363 A 2/1999 Hoh et al.
5,879,575 A 3/1999 Tepman et al.
5,882,424 A 3/1999 Taylor et al.
5,897,740 A 4/1999 Tamura
6,068,729 A 5/2000 Shrotriya
6,070,552 A 6/2000 Mizuno et al.
6,071,375 A 6/2000 Chen et al.
6,079,426 A 6/2000 Subrahmanyam et al.
6,090,718 A 7/2000 Soga et al.
6,108,929 A 8/2000 Kato et al.
6,124,927 A * 9/2000 Zhong et al. ............... 356/311
6,132,577 A 10/2000 Smith et al.
6,281,116 B1 * 8/2001 Yanagida .................... 438/637
6,283,130 B1 * 9/2001 Tamura ...................... 134/1.1

FOREIGN PATENT DOCUMENTS

EP 0463373 1/1992
EP 0516043 12/1992
EP 0555546 8/1993
EP 697467 A1 2/1996
EP 0697467 2/1996
EP 0709877 5/1996
EP 0746015 1/1998
JP 4056770 2/1982
JP 59142839 A2 8/1984
JP 60059739 4/1985
JP 63005532 1/1988
JP 6303578 A2 2/1988
JP 63089684 4/1988
JP 1064326 A2 3/1989
JP 6025859 A2 2/1994
JP 6177092 6/1994
JP 7029879 1/1995
JP 6240728 2/1997
JP 9036085 2/1997
JP 9129596 5/1997
JP 9249975 A2 9/1997
JP 1054274 2/1998
JP 1023387 9/1998
JP 11345802 12/1999
WO 9615545 5/1996
WO 9906610 A1 2/1999
WO 9920812 4/1999
WO 0108209 2/2001
WO 0188966 11/2001

OTHER PUBLICATIONS

PCT Search Report dated Oct. 28, 1999; European Patent Office, P.B. 5818 Patentlaan 2 NL–2280 HV Rijswijk.

PCT Notification of International Search Report dated Feb. 4, 1999; European Patent Office, P.B. 5818 Patentlaan 2 NL–2280 HV Rijswijk.

* cited by examiner

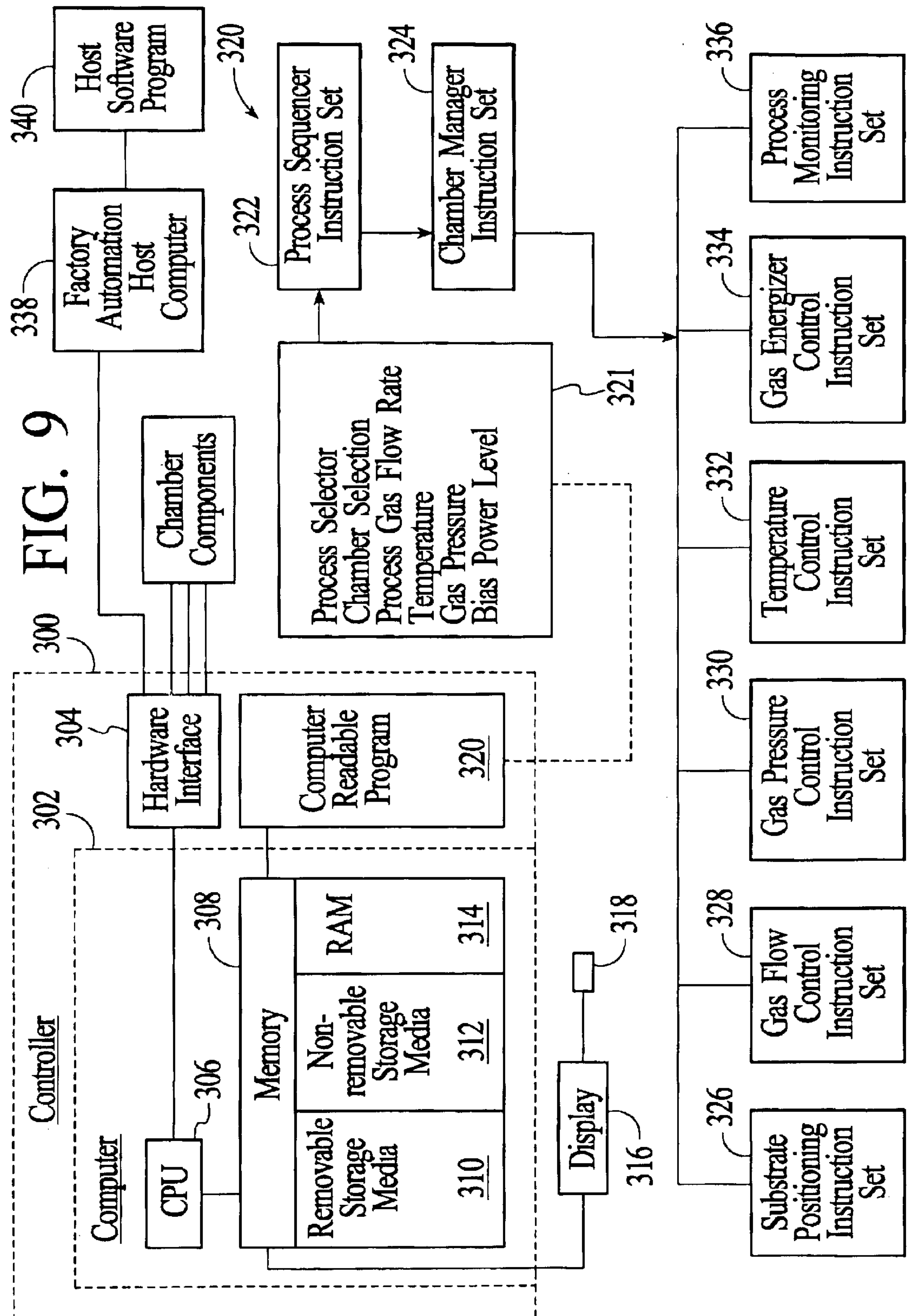
FIG. 9
Host Software Program
340
Factory Automation Host Computer
338
320
Process Sequencer Instruction Set
322
Chamber Manager Instruction Set
324
Process Monitoring Instruction Set
336
Gas Energizer Control Instruction Set
334
Temperature Control Instruction Set
332
Gas Pressure Control Instruction Set
330
Gas Flow Control Instruction Set
328
Substrate Positioning Instruction Set
326
Chamber Components
Process Selector
Chamber Selection
Process Gas Flow Rate
Temperature
Gas Pressure
Bias Power Level
321
300
Controller
302
Computer
304
Hardware Interface
Computer Readable Program
320
306
CPU
308
Memory
Removable Storage Media
310
Non-removable Storage Media
312
RAM
314
Display
316
318

CLEANING OF MULTICOMPOSITIONAL ETCHANT RESIDUES

BACKGROUND

The present invention relates to the cleaning of etchant residues formed in the etching of substrates.

When an energized gas is used to process a substrate in a chamber, for example to etch the substrate, etchant residues are often deposited on internal surfaces of the chamber. The deposited etchant residues may adversely affect the substrate processing operations conducted in the chamber. For example, the etchant residues can corrode the surfaces of the chamber and its internal components, requiring frequent replacement of the components, and thereby increasing chamber downtime. The accumulated etchant residues can also flake off from the chamber surfaces and contaminate substrates being etched in the chamber. Thus, the etchant residues needs to be periodically cleaned off the chamber surfaces.

In conventional cleaning processes, a cleaning gas energized by RF or microwave energy is provided in the chamber to clean the etchant residues. The cleaning gas composition and other process parameters are tailored to clean the particular etchant residue composition that is generated during the etching process. For example, a conventional cleaning process to clean a chamber having silicon containing etchant residues that are generated by the etching of silicon containing substrate material in the chamber, may use a cleaning gas composition tailored to clean the silicon containing etchant residues.

However, conventional cleaning processes are generally not very efficient at cleaning etchant residues composed of multiple layers having different chemical compositions, such as those generated in foundry etching processes. In foundry etching, the same chamber is often used to etch a number of different types of substrate materials, thereby often generating layers of etchant residues having a variety of different types of compositions which deposit upon one another on the surfaces in the chamber. Conventional cleaning processes do not efficiently clean these multi-layer etchant residues because they are tailored to clean the single composition etching residues formed in a simpler etching process. Thus, when conventional cleaning process are used to clean foundry etch chambers, the chamber is often cleaned non-uniformly because the cleaning gas is more effective at cleaning certain compositions of etchant residues. The conventional cleaning process can also result in overcleaning and resultant erosion of the foundry etch chamber.

Thus, it is desirable to have a cleaning process capable of cleaning a chamber after the etching of a number of different types of substrates in the chamber. It is further desirable to have a cleaning process capable of cleaning multi-layer etchant residues without excessive erosion of the underlying chamber surfaces.

SUMMARY

A substrate processing apparatus comprising a chamber comprising a substrate transport to transport a substrate onto a substrate support in the chamber, a gas supply to provide a gas in the chamber, a gas energizer to energize the gas, and a gas exhaust to exhaust the gas, a controller to operate the substrate support, gas supply, gas energizer, and gas exhaust, to set etching process conditions in the chamber to etch a plurality of substrates, thereby depositing etchant residues on surfaces in the chamber, and cleaning process conditions in the chamber to clean the etchant residues, the process conditions comprising a volumetric flow ratio of $O_2$ to $CF_4$ of from about 1:1 to about 1:40.

A method of processing substrates in a chamber, the method comprising etching a plurality of substrates in the chamber, thereby depositing etchant residues on surfaces in the chamber, and cleaning the etchant residues by introducing a cleaning gas comprising $O_2$ and $CF_4$ into the chamber, the volumetric flow ratio of $O_2$ to $CF_4$ being from about 1:1 to about 1:40, energizing the cleaning gas, and exhausting the cleaning gas from the chamber.

A substrate processing apparatus comprising a chamber comprising a substrate transport to transport a substrate onto a substrate support in the chamber, a gas supply to provide a gas in the chamber, a gas energizer to energize the gas, and a gas exhaust to exhaust the gas, a controller to operate the substrate support, gas supply, gas energizer, and gas exhaust, to set etching process conditions in the chamber to etch a plurality of substrates, thereby depositing etchant residues on surfaces in the chamber, sacrificial substrate processing conditions to process one or more sacrificial substrates in the chamber, thereby depositing a sacrificial coating on surfaces in the chamber, and cleaning process conditions in the chamber to clean the etchant residues and sacrificial coating, the process conditions comprising a volumetric flow ratio of $O_2$ to $CF_4$.

A method of processing substrates in a chamber, the method comprising etching a plurality of substrates in the chamber, thereby depositing etchant residues on surfaces in the chamber, processing one or more sacrificial substrates in the chamber, thereby depositing a sacrificial coating on surfaces in the chamber, and cleaning the etchant residues and sacrificial coating by introducing a cleaning gas comprising $O_2$ and $CF_4$ into the chamber, energizing the cleaning gas, and exhausting the cleaning gas from the chamber.

DRAWINGS

These and other features, aspects, and advantages of the present invention will become better understood with regard to the following description, appended claims, and accompanying drawings which illustrate examples of the invention, where:

FIG. 9 is an illustrative block diagram of a controller comprising a computer readable program according to the present invention.

DESCRIPTION

Figure 1:
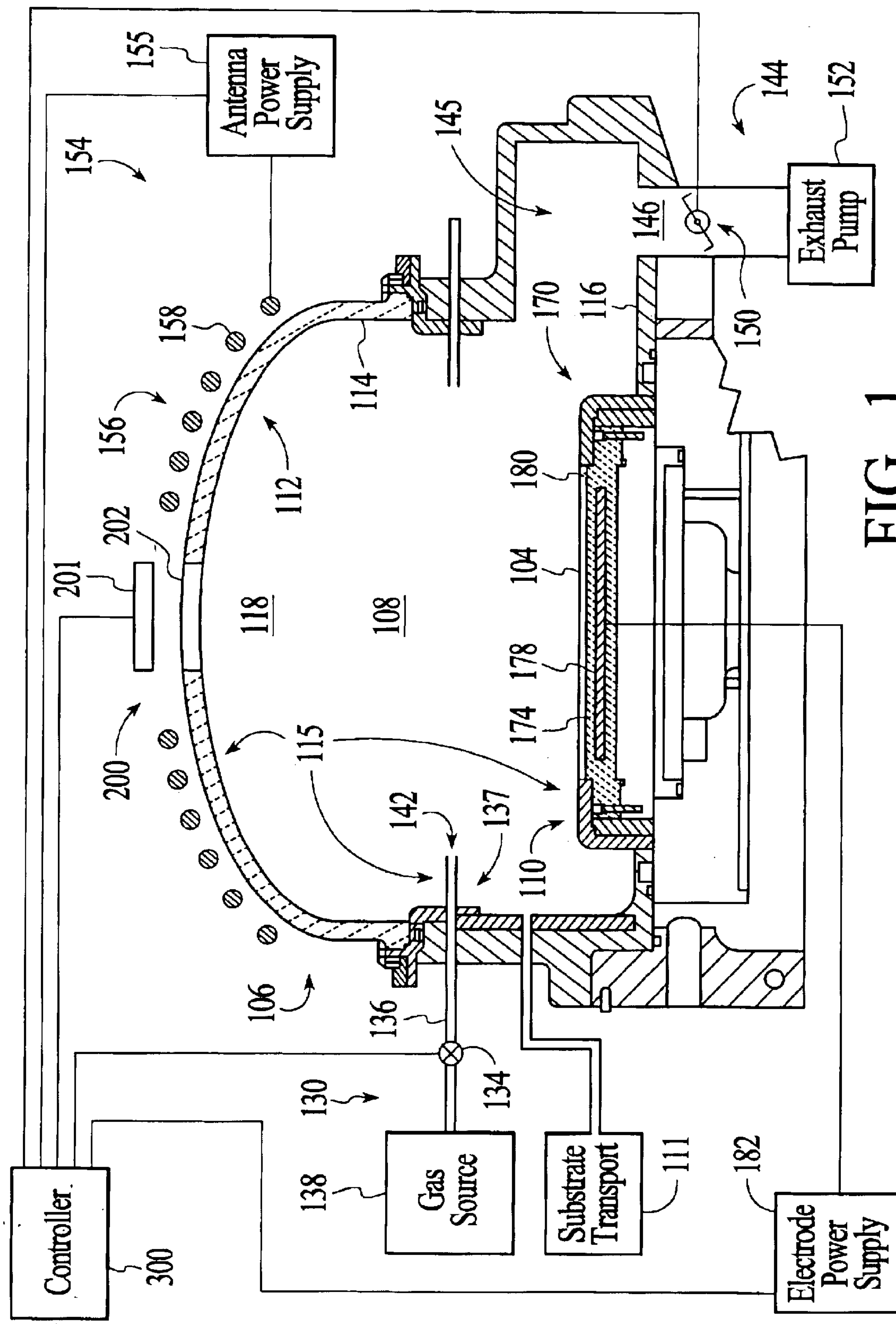
FIG. 1 is a schematic sectional side view of an exemplary version of an etching chamber according to the present invention.

An etching chamber 106 comprises, for example, a decoupled plasma source (DPS) chamber, schematically illustrated in FIG. 1, and which is commercially available from Applied Materials Inc., Santa Clara, Calif. The etching chamber 106 may be attached to a mainframe unit that contains and provides electrical, plumbing, substrate transport and other support functions for the chamber 106. Exemplary mainframe units compatible with the illustrative embodiment of the chamber 106 are currently commercially available as the Precision 5000™ systems from Applied Materials, Inc., of Santa Clara, Calif. The embodiment of the etching chamber 106 illustrated in FIG. 1 is provided only to illustrate the invention, and should not be used to limit the scope of the invention or its equivalents to the exemplary embodiments provided herein.

Generally, the etching chamber 106 comprises walls 107 typically fabricated from metal or ceramic materials. Metals commonly used to fabricate the chamber 106 include aluminum, anodized aluminum, "HAYNES 242," "Al-6061," "SS 304," "SS 316," and INCONEL, of which anodized aluminum is preferred. The wall 107 may comprise sidewalls 114, a bottom wall 116, and a ceiling 118. The ceiling 118 may comprise a substantially arcuate shape, or in other versions, the ceiling 118 may comprise a domed, substantially flat, or multi-radius shaped portion. The chamber 106 typically comprises a volume of at least about 5,000 cm3, and more preferably from about 10,000 to about 50,000 cm3. In operation, gas is introduced into the chamber 106 through a gas supply 130. The gas supply 130 may include a gas source 138 and a gas distributor 137, the gas distributor 137 comprising conduits 136 having flow control valves 134 to control the flow of gas into the chamber 106 and gas outlets 142. In one version, the gas outlets 142 may be arranged about a periphery of the substrate 104, as shown in FIG. 1. A gas exhaust 144 may exhaust spent gas and etchant byproducts from the chamber 106. The gas exhaust 144 may comprise a pumping channel 146 to receive the spent gas, a throttle valve 150 to control the pressure of gas in the chamber 106, and one or more exhaust pumps 152. The gas exhaust 144 may also contain a system for abating undesirable gases.

The gas is energized to process the substrate 104 by a gas energizer 154 that couples energy to the gas in the process zone 108 of the chamber 106 (as shown) or in a remote zone upstream from the chamber 106 (not shown). In one version, the gas energizer 154 comprises an antenna 156 comprising one or more inductor coils 158 which may have a circular symmetry about the center of the chamber 106. Typically, the antenna 156 comprises solenoids having from about 1 to about 20 turns. A suitable arrangement of solenoids is selected to provide a strong inductive flux linkage and coupling to the process gas. When the antenna 156 is positioned near the ceiling 118 of the chamber 106, the adjacent portion of the ceiling may be made from a dielectric material, such as silicon dioxide, which is transparent to RF or electromagnetic energy. An antenna power supply 155 provides, for example, RF power to the antenna 156 at a frequency of typically about 50 KHz to about 60 MHz, and more typically about 13.56 MHz; and at a power level of from about 100 to about 5000 Watts.

In one version, the gas energizer 154 may also or alternatively comprise process electrodes (not shown) that may be used to energize or further energize the process gas. Typically, the process electrodes include one electrode (not shown) in a wall, such as a sidewall 114 or ceiling 118 of the chamber 106 that may be capacitively coupled to another electrode, such as an electrode in the support 110 below the substrate 104. Generally, the electrodes may be electrically biased relative to one another by an electrode voltage supply (not shown) that includes an AC voltage supply for providing an RF bias voltage. The RF bias voltage may comprise frequencies of about 50 kHz to about 60 MHz, and is preferably about 13.56 MHz, and the power level of the RF bias current is typically from about 50 to about 3000 watts. The gas energizer 154 may also comprise a microwave source (not shown) to energize the gas in the chamber 106 or in a remote chamber (also not shown).

In operation, a substrate transport 111, such as for example a robotic arm and associated robotics, transports the substrate 104 onto the substrate support 110 in the chamber 106. The support 110 may comprise an electrostatic chuck 170 which comprises a dielectric body 174 which at least partially covers an electrode 178 and which may include a substrate receiving surface 180. The electrode 178 may also serve as one of the process electrodes discussed above. The electrode 178 may be capable of generating an electrostatic charge for electrostatically holding the substrate 104 to the support 110 or electrostatic chuck 170. A power supply 182 provides the chucking voltage to the electrode 178.

The chamber 106 may also comprise a detector 200 for monitoring a process, such as a cleaning process, in the chamber 106 and sending a signal to a chamber controller 300. The detector 200 should be positioned to detect a radiation emission from, for example, an energized gas in the chamber 106. Also, the detector 200 should have the sensitivity required to accurately detect the changes in the attribute of the radiation emission. For example, the detector 200 should have the sensitivity required to determine when an endpoint value of the intensity of the radiation emission has been obtained. In one version, a suitable detector 200 may comprise a sensor 201, such as for example a spectrometer, charge coupled device, or photodiode mounted to detect radiation passing through a window 202 formed in a wall 107 of the chamber 106 that is permeable to radiation of the desired wavelengths. The detector 200 may also comprise a monochrometer or optical filter, which may be used to select the desired wavelength of radiation to be monitored.

A number of different processes may be performed in the chamber 106. The different processes may be performed to etch different materials on different substrates 104, using process parameters and etchant gas compositions which are selected according to the type of material to be etched. For example, multiple etching processes may be performed to etch silicon containing materials, such as for example polycide, polysilicon, tungsten silicide, titanium silicide; carbon containing materials such as for example low k dielectric materials; metal containing materials; or resist materials such as for example photoresist which may be patterned to a desirable pattern configuration which is to be etched in the underlying layers; on different batches of substrates 104. The substrates 104 can be silicon wafers, compound semiconductors, or dielectric materials such as silicon oxide or aluminum oxide. The multiple etching processes performed may comprise, for example, polysilicon, polisilicide, or photoresist etching processes. The multiple etching processes may generate a variety of different types of etchant residues which deposit as layers on the internal surfaces 115 in the chamber 106 to form a multi-layer etchant residue on the chamber surfaces 115. The different etching processes are often performed to etch the different etchant residues.

The multiple etching processes may include a number of processes, for example, a first etching process to etch a first material on one or more first substrates 104, and a second etching process to etch a second material on one or more second substrates 104. The first etching process may be used to first substrates 104 comprising a first material such as tungsten silicide. In the first etching process, the substrate 104 is etched by placing a first substrate 104 on a substrate support 110, introducing a first etchant gas into the etching chamber 106, and energizing the etchant gas by, for example, applying power to an antenna about the chamber 106 and/or an electrode 178 in the chamber 106. To etch tungsten silicide, the first etchant gas typically comprises one or more of $Cl_2$, $O_2$, and $N_2$; and the gas is energized by applying an RF power level of about 1200 Watts to the antenna 156 about the chamber 106 and a bias power level of about 120 Watts to the electrode 178 in the chamber 106. After a batch of the first substrates 104 are etched, a second etching process may be used to etch a second material, such as for example, silicon, on a batch of second substrates 104. In the second etching process, the second substrates 104 are placed in the chamber 106, a second etchant gas is introduced into the etching chamber 106, and the gas is energized by applying power to the antenna 156 and electrode 178 in the chamber 106. To etch silicon oxide, the second etchant gas may include one or more of CF4, HBr, $Cl_2$, and $O_2$; and may be energized by applying an RF power level of about 750 Watts to the antenna 156 and a bias power level of about 70 Watts to the electrode 178.

The multiple etching processes conducted in the etching chamber 106 generate a variety of different types of etchant residues which deposit as successive layers on the internal surfaces 115 in the chamber 106. For example, in the first etching process, silicon-containing etchant residues such as $SiO_x$, may be generated by the reaction of the tungsten silicide material on the substrates 104 with the energized etchant gas; and in the second etching process, carbon-containing etchant residues, such as polymeric $CF_x$ containing residues, may be formed by the decomposition of the carbon-containing $CF_4$ etchant gas. The compositionally different residues deposit as successive layers on one another to form a multi-layer process residue on the chamber surfaces.

The different types of etchant residues formed in the different etching processes, may also form a complex distribution pattern of etchant residue dispersed about the chamber 106 depending upon the types of etching processes performed in the chamber. For example, certain etching processes result in the increased deposition of etchant residues in a process zone 108 of the chamber 106, in which a number of substrates 104 are etched, whereas other etching processes may generate increased residue deposition about an exhaust region of the chamber 106, such as a pumping channel 146 of the gas exhaust 144. Thus, the etching of multiple different substrates 104 in the chamber 106 may result in the non-uniform deposition of different types of etchant residues across the internal surfaces 115 in the chamber 106.

A cleaning process is performed to remove the multi-layer etchant residues generated in the multiple etching processes. The cleaning process may generally comprise introducing a cleaning gas into the chamber 106 and energizing the cleaning gas, either within the chamber 106 or in a remote energizing chamber 106, and selecting process parameters, such as cleaning gas composition, pressure and power levels, to uniformly clean a distribution of etchant residues in the chamber. The cleaning process is capable of cleaning the different types of etchant residues compositions which may be generated in the multiple etching processes at good cleaning rates and without excessive corrosion of the internal surfaces 115 in the chamber 106. The cleaning process may also be capable of cleaning the etchant residues deposited in different regions in the chamber 106, such as the process zone 108 or the gas exhaust 144, without undercleaning or overcleaning the regions. The cleaning process may also be performed to reduce contamination of subsequent substrates 104 processed in the chamber 106 and also to inhibit the corrosion of surfaces 115 in the chamber 106 by etchant residues.

In the cleaning process, a cleaning gas comprising $O_2$ and $CF_4$ are provided to clean the chamber. The oxygen containing gas is capable of cleaning carbon containing etchant residue, such as for example $CF_x$, which may be generated by etching a substrate with a carbon containing gas such as $CF_4$, by reacting with the residues to form volatile fluorine and $CO_x$ species which may be exhausted from the chamber 106. The fluorine containing $CF_4$ gas is capable of cleaning silicon containing etchant residue, such as for example $SiO_x$ by forming volatile residues comprising $SiF_x$ which are also exhausted from the chamber 106. The flow rate of the oxygen containing gas and the flow rate of the fluorine containing gas is regulated to provide a volumetric flow ratio of $O_2$ to $CF_4$ that is capable of providing uniform cleaning of the different types of etchant residues generated in multiple etching processes. The volumetric flow ratio of the oxygen containing gas to the fluorine containing gas is also selected such that different types of etchant residues are cleaned at good cleaning rates.

Figure 2:
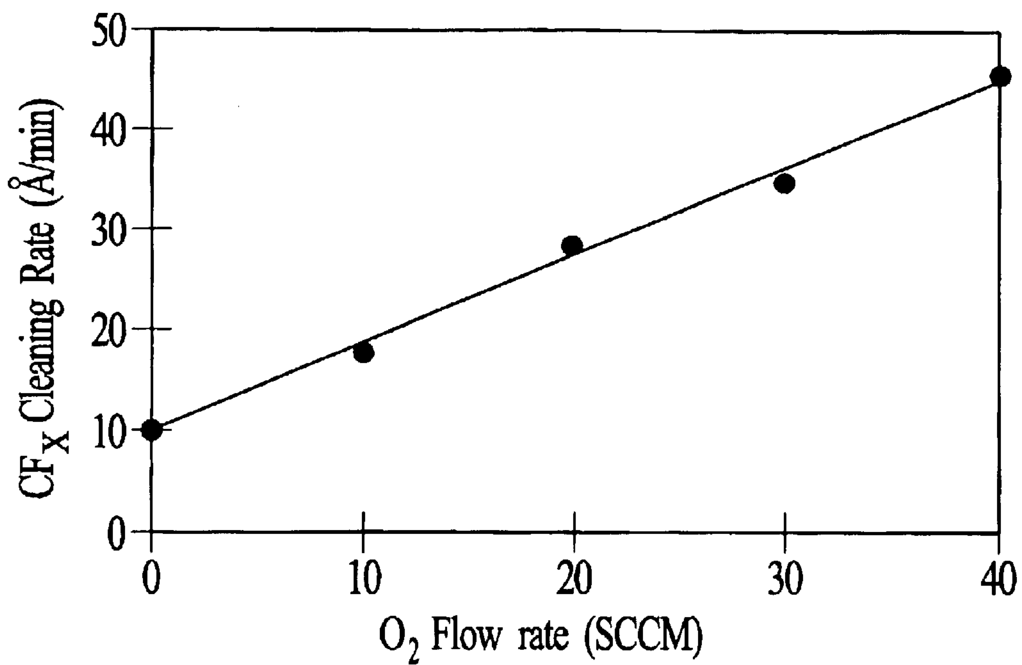
FIG. 2 is a graph of the cleaning rate of etchant residues comprising $CF_x$, as a function of increasing $O_2$ flow rate.
Figure 3:
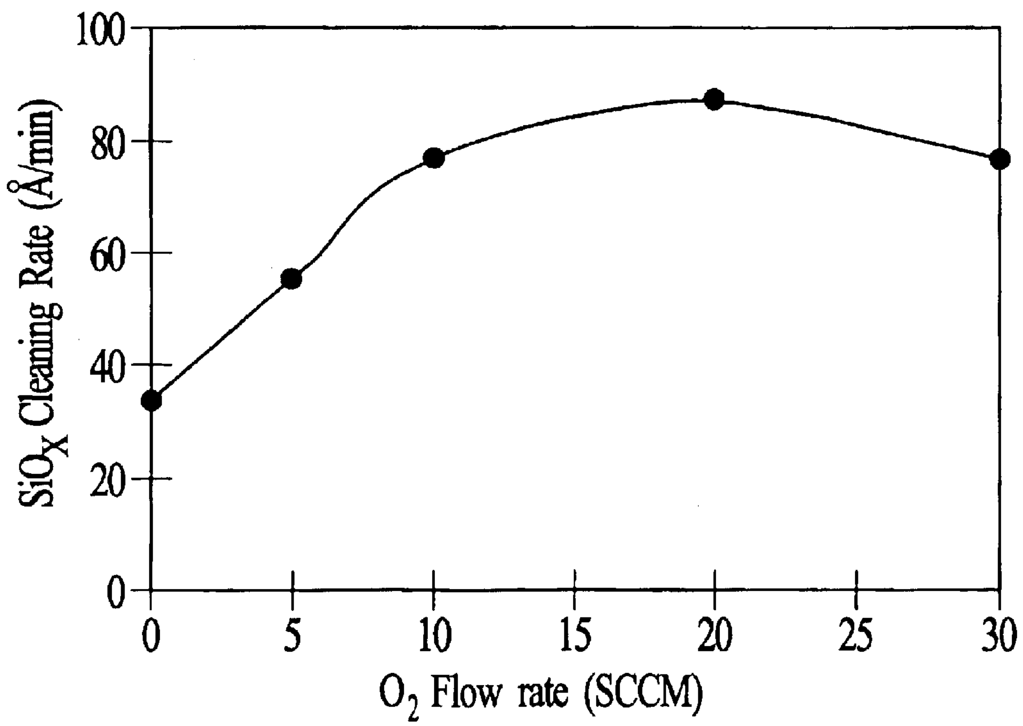
FIG. 3 is a graph of the cleaning rate of etchant residues comprising $SiO_x$, as a function of increasing $O_2$ flow rate.

The cleaning ability of a cleaning gas comprising $O_2$ and $CF_4$ is demonstrated in FIGS. 2 and 3. These figures show the cleaning rates of etchant residues comprising $CF_x$ and $SiO_x$ materials, respectively, for increasing flow rates of an oxygen containing gas comprising $O_2$ added to a fluorocarbon gas comprising 100 sccm of $CF_4$ to form the cleaning gas. The rate of cleaning the $CF_x$ containing residues, as shown in FIG. 2, increases substantially linearly as the $O_2$ flow rate is increased. Thus, increasing the $O_2$ flow rate increases the cleaning rate for the cleaning of etchant residues comprising $CF_x$. However, FIG. 3 also demonstrates that good cleaning rates of etchant residues comprising $SiO_x$ are obtained only within a certain range of the $O_2$ flow rate. The $SiO_x$ cleaning rate increases until the $O_2$ flow rate reaches about 20 sccm, which is equivalent to a volumetric flow ratio of $O_2$ to $CF_4$ of about 1:5, and then decreases. Thus, these graphs show that in order to provide good cleaning rates for multiple layers of different compositions of etchant residues, such as for example the silicon and carbon containing etchant residues $SiO_x$ and $CF_x$, respectively, the volumetric flow ratio of the oxygen containing gas $O_2$ to the fluorocarbon gas $CF_4$ should be within a good volumetric flow ratio range, such as the range of from about 1:1 to 1:40, and even from about 1:2 to about 1:8, and even about 1:5.

Figure 4:
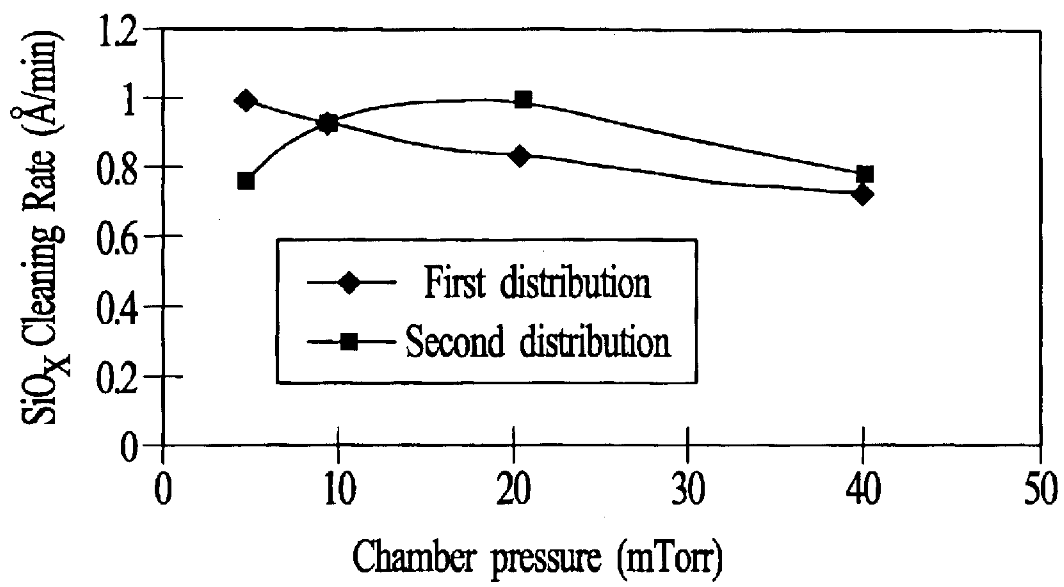
FIG. 4 is graph of the cleaning rate of first and second distributions of etchant residues comprising $SiO_x$ and for increasing gas pressure.
Figure 5:
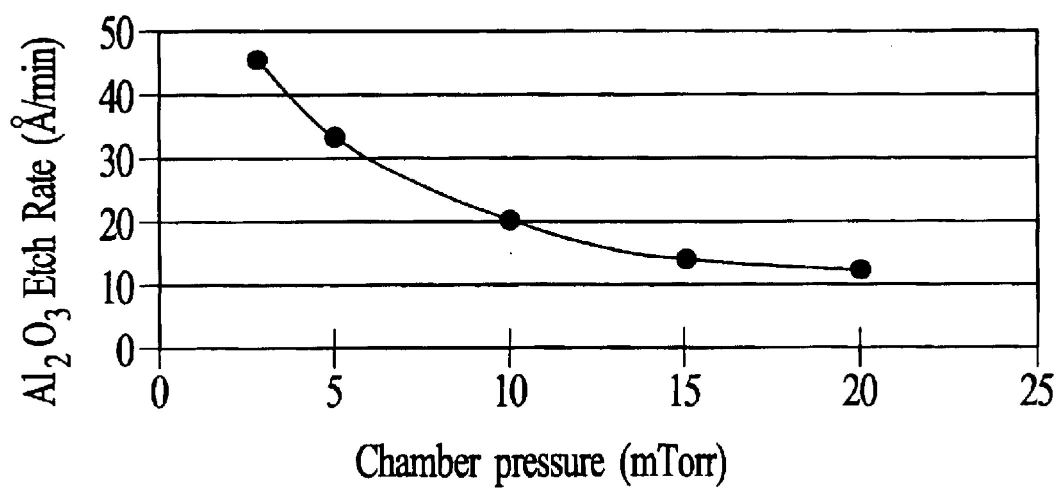
FIG. 5 is a graph of the etch rate of $Al_2O_3$ for increasing gas pressure.

The gas pressure during the cleaning process may also be selected to further enhance cleaning of the different compositions of etchant residues formed in the multiple etching processes. Good cleaning rates were obtained for gas pressures in the range of from about 5 to about 40 mTorr, and even about 10 mTorr. The cleaning rates for etchant residues comprising $SiO_x$ within this range of pressures are shown in FIG. 4. In this Figure, the cleaning rate of two different distributions of $SiO_x$ containing etchant residues are shown for increasing gas pressure. In the first distribution, the etchant residues were deposited mostly on the surfaces in the process zone 108 which surrounds the energized etchant gas formed in the etching process, such as the surfaces of the ceiling 118 and sidewalls 114 in the chamber 106. In the second distribution, the etchant residues were formed about the exhaust region 145 of the chamber 106 which is further away from the process zone 108 and the energized etchant gas, such as on the surfaces of the pumping channel 146 and bottom wall 116. The cleaning rates of both the first and second distributions are about the same indicating that the residues are uniformly cleaned off from all the regions of the chamber 106. In particular, at a gas pressure of about 10 mTorr, substantially identical cleaning rates were provided for the first and second distributions and without overcleaning or undercleaning.

The chamber pressure during the cleaning process may also be selected to reduce the corrosion of the chamber surfaces 115 by the energized cleaning gas. FIG. 4 shows the etch rate of a chamber surface material, $Al_2O_3$, for increasing pressure in a chamber cleaning process. FIG. 4 demonstrates that the etch rate of the $Al_2O_3$, and hence the corrosion of chamber surfaces 115 is reduced for increased gas pressures. It is believed that this results because at higher gas pressures, the plasma is not as highly energized. However, gas pressures which are too high may lead to the non-uniform cleaning of different distributions of process residues in the chamber 106, as described above. Thus, the range of from about 5 mTorr to about 40 mTorr, and more preferably, about 10 mTorr, was found to provide good chamber cleaning rates with reduced corrosion of the chamber surfaces 115.

Figure 6:
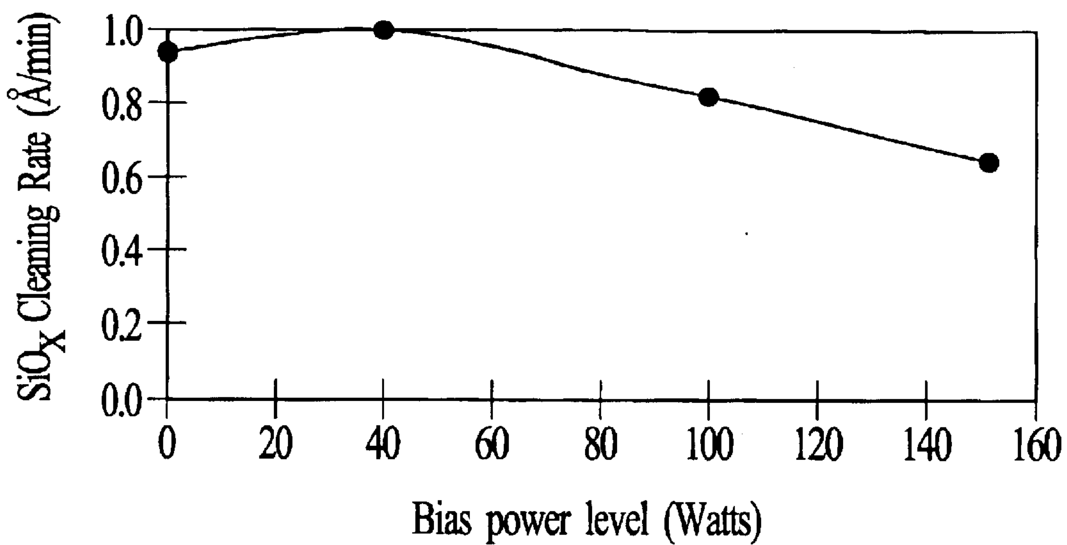
FIG. 6 is a graph of the cleaning rate of etchant residues comprising $SiO_x$, for increasing bias power level applied to an electrode in the chamber.

The cleaning gas is energized in the chamber 106 at levels that allow effective cleaning of the multiple layer etchant residues generated in the different etching processes. For example, the electrodes 178 may be operated by applying a relatively low bias power level of less than about 40 Watts, or even about 1 Watt, to provide good cleaning of the etchant residues. FIG. 6 demonstrates the cleaning of etchant residues comprising $SiO_x$ for increasing bias power level applied to the electrode 178. FIG. 6 shows that while the cleaning rate increases with bias power level applied to the electrode 178 up to about 40 Watts, after this point, the cleaning rate decreases with increasing bias power level due to a build-up of cleaning process residues which accumulate at the higher bias power levels. Thus, at the relatively low bias power level of less than about 40 Watts and even about 1 Watt, a good cleaning rate of the multi-layer etchant residues is provided. The RF power level applied to an antenna 156 about the chamber 106 may also be selected to provide good cleaning rates without excessive corrosion of the chamber surfaces 115. A suitable RF power level may be from about 200 to about 1500 Watts and may even be about 600 Watts.

The cleaning process may also be monitored to determine an endpoint of the cleaning process. The cleaning endpoint may be, for example, the time at which the chamber 106 has been substantially cleaned of etchant residue, or the time at which the chamber 106 has been sufficiently cleaned that subsequent substrates 104 may be processed in the chamber 106 without contamination. By determining the endpoint of the cleaning process, the chamber may be cleaned without undercleaning or overcleaning the chamber 106. For example, the cleaning process may be monitored by detecting an intensity of a wavelength of a radiation emission from the energized cleaning gas in the chamber 106. The intensity of the selected wavelength is related to the presence of detectable etchant residues in the chamber 106. For example, the intensity of the selected wavelength may be related to the presence of two or more types of etchant residues in the chamber 106, such as the presence of silicon or carbon containing etchant residue, such as for example $SiO_x$ and $CF_x$, in the chamber 106. Etchant residues containing $SiO_x$ are detectable by observing the intensity of a 4405 Å wavelength of the radiation emissions from the chamber, whereas etchant residues containing $CF_x$ are detectable by observing the intensities of wavelengths in the range of 4000 to 6000 Å; thus, a suitable detection wavelength may be at 4405 Å. The cleaning process may be monitored by detecting the intensity of this wavelength to determine when both the $SiO_x$ and $CF_x$ containing residues have been cleaned.

Figure 7:
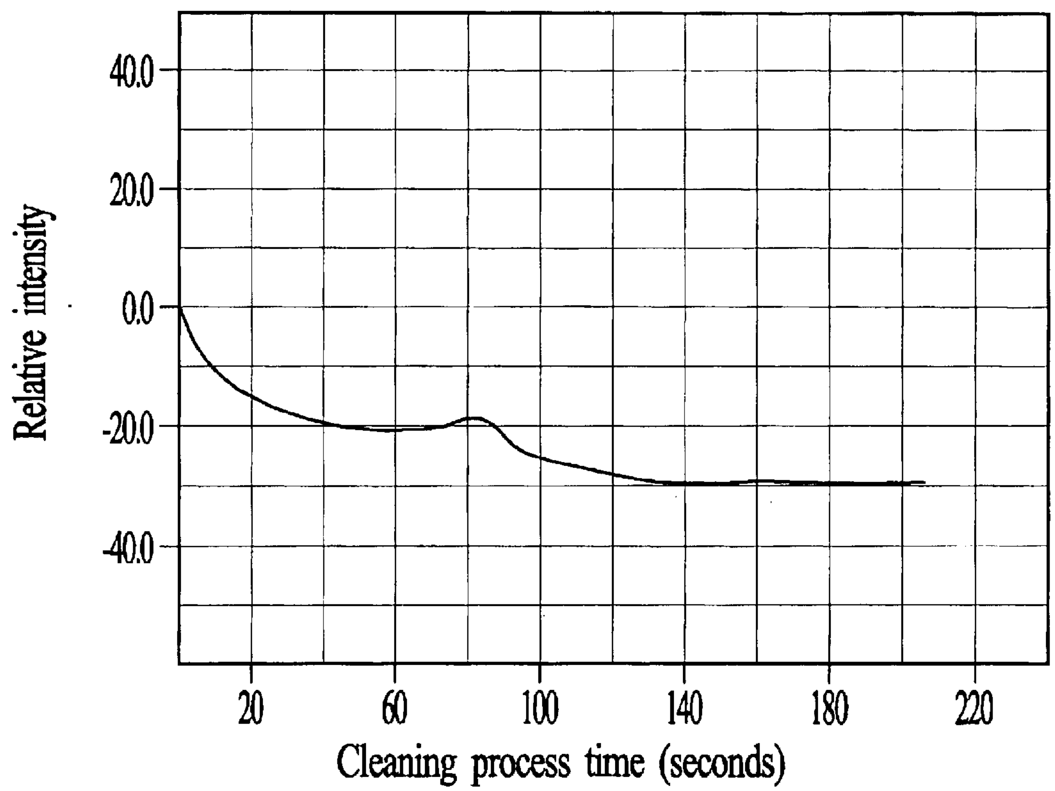
FIG. 7 is graph of the relative intensity of a radiation emission emitted by an energized cleaning gas at 4405 Å for increasing cleaning process time.

The intensity of the selected wavelength of the radiation emission from the energized gas may be monitored to determine the endpoint of cleaning of different types of distributions of the etchant residues across different regions of the chamber 106. FIG. 7 graphs the relative intensity of the cleaning gas radiation emission at 4405 Å for increasing cleaning process time. This graph was used to determine the endpoint for the cleaning process. The relative intensity of the radiation wavelength generally decreases with time, with the exception of a small increase in the relative intensity at a time of about 85 seconds. Towards the end of the cleaning process, the relative intensity levels off to a substantially constant value, indicating that the etchant residues have been substantially cleaned from the chamber 106. For this graph the cleaning endpoint is determined to be at about 140 seconds.

Figure 8:
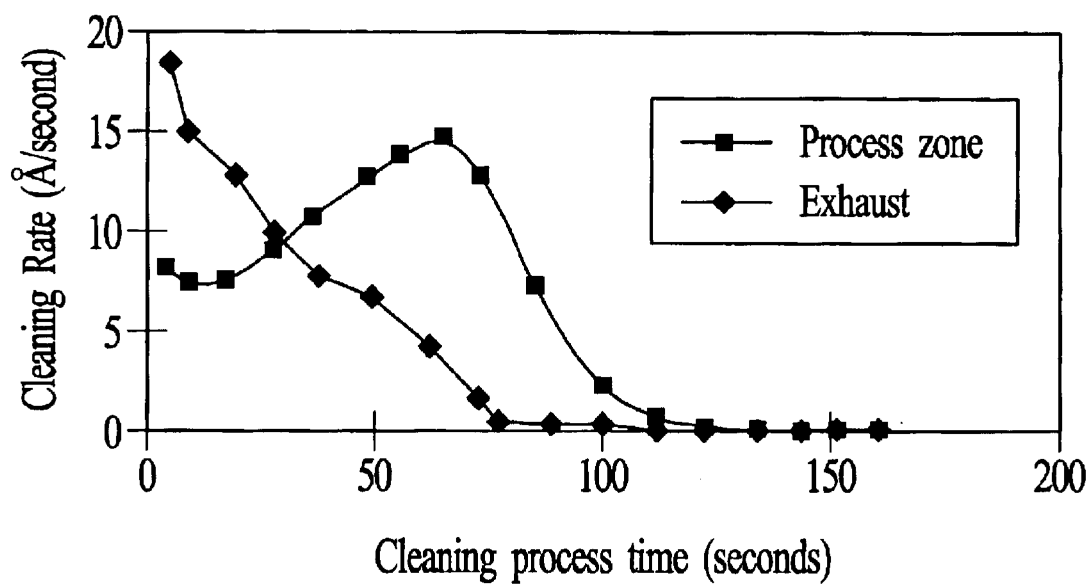
FIG. 8 is a graph of the cleaning rate of etchant residues deposited about a process zone and exhaust region of an etching chamber, for increasing cleaning process time.

To determine the accuracy of the graphically determined cleaning endpoint time, the endpoint time was also measured by monitoring the weight loss registered by a quartz crystal microbalance positioned in the chamber 106. FIG. 8 graphs the weight of etchant residues as they removed from the quartz crystal microbalance during the cleaning process. The cleaning rates were measured at two regions, namely in the process zone 108 and in an exhaust region 145 about the gas exhaust 144. The graph demonstrates that the cleaning rate for etchant residues deposited in the process zone 108 decreases to a constant value faster than the cleaning rate for etchant residues deposited in the exhaust region 145 showing that the process zone 108 is cleaned more quickly than the exhaust region 145. The cleaning rate at the exhaust region 145 starts off lower, increases at about 70 seconds, and then decreases to a constant value at about 140 seconds. Thus, the point at which both regions in the chamber 106 have been cleaned is at about 140 seconds. This was the same time as determined by monitoring the cleaning gas radiation emission at 4405 Å. Thus, the cleaning process endpoint for the cleaning of different types of residues having different distributions in the chamber 106 may be determined by monitoring the radiation emission from the energized cleaning gas in the chamber 106.

Because different types of etching processes are performed in the chamber 106 in the foundry etching processes, it is not always known whether etchant residues have actually been formed on the chamber surfaces. Running a cleaning process in a chamber which does not have an etchant residues would result in erosion of the chamber walls (which are typically aluminum) by the cleaning gas to form erosion byproducts, such as $AlF_x$. To ensure that the chamber surfaces are at least partially coated with etchant residues to prevent such erosion, the chamber 106 may be treated by depositing a sacrificial coating on the internal surfaces in the chamber 106, before any production substrate etching or cleaning process is performed. The sacrificial coating reduces erosion of surfaces 115 in the chamber 106 in the event that etchant residues have not formed on the chamber surfaces, by providing a sacrificial coating that may be removed by the cleaning gas. In this process, a sacrificial substrate 104 is processed in the chamber 106, for example by etching the substrate, to deposit a sacrificial coating on the internal surfaces 115 in the chamber 106. The sacrificial coating ensures that some material is present on the chamber surfaces when the cleaning gas is used to clean the chamber 106. The treatment substrate 104 may comprise materials such as silicon containing materials, for example, a bare silicon wafer. The silicon wafer may be processed by an etchant gas comprising 70 sccm $Cl_2$, 110 sccm HBr, and 5 to 10 sccm $O_2$ to etch the silicon and deposit sacrificial $SiO_x$ residues on the chamber surfaces. The etchant gases may be maintained at a pressure of from about 3 to about 10 mTorr in the chamber 106 while the etchant gas is energized by applying an RF power level of 1000 to 1500 Watts to the antenna 156 and 80 to 150 Watts to the electrode 178.

The multiple etching and cleaning processes may be performed in the chamber 106 illustrated in FIG. 1 by operating the chamber components with a controller 300 as shown in FIG. 9. The controller 300 may comprise a computer 302 having a central processor unit (CPU) 306, such as for example a 68040 microprocessor, commercially available from Synergy Microsystems, Calif., or a Pentium Processor commercially available from Intel Corporation, Santa Clara, California, that is coupled to a hardware interface 304, memory 308 and peripheral computer components, as shown in FIG. 9. Preferably, the memory 308 may include a removable storage media 310, such as for example a CD or floppy drive, a non-removable storage media 312, such as for example a hard drive, and random access memory 314. The controller 300 may further comprise a plurality of interface cards including, for example, analog and digital input and output boards, interface boards, and motor controller boards. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

The data signals received by and/or evaluated by the controller 300 may be sent to a factory automation host computer 338. The factory automation host computer 338 may comprise a host software program 340 that evaluates data from several systems, platforms or chambers 106, and for batches of substrates 104 or over an extended period of time, to identify statistical process control parameters of (i) the processes conducted on the substrates 104, (ii) a property that may vary in a statistical relationship across a single substrate 104, or (iii) a property that may vary in a statistical relationship across a batch of substrates 104. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 104 from the processing sequence, for example, if a substrate property is inadequate or does not fall within a statistically determined range of values, or if a process parameter deviates from an acceptable range; (ii) end processing in a particular chamber 106, or (iii) adjust process conditions upon a determination of an unsuitable property of the substrate 104 or process parameter. The factory automation host computer 338 may also provide the instruction signal at the beginning or end of processing of the substrate 104 in response to evaluation of the data by the host software program 340.

In one version the controller 300 comprises a computer-readable program 320 may be stored in the memory 308, for example on the non-removable storage media 312 or on the removable storage media 310. The computer readable program 320 generally comprises process control software comprising program code to operate the chamber 106 and its components, process monitoring software to monitor the processes being performed in the chamber 106, safety systems software, and other control software, as for example, illustrated in FIG. 9. The computer-readable program 320 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of pre-compiled library routines. To execute the linked, compiled object code, the user invokes the object code, causing the CPU 306 to read and execute the code to perform the tasks identified in the program.

An illustrative block diagram of a hierarchical control structure of a specific embodiment of a computer readable program 320 according to the present invention is also shown in FIG. 9. Using a light pen interface, a user enters a process set and chamber number into the computer readable program 320 in response to menus or screens displayed on the CRT terminal. The computer readable program includes process selector program code 321 to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure, gas energizer settings such as RF or microwave power levels, magnetic field generation, heat transfer gas pressure, and wall temperature.

The process sequencer instruction set 322 comprises program code to accept a chamber type and set of process parameters from the process selector 321 and to control its operation. The sequencer program 322 initiates execution of the process set by passing the particular process parameters to a chamber manager instruction set 324 that controls multiple processing tasks in the process chamber 106. Typically, the process chamber instruction set 324 includes a substrate positioning instruction set 326, a gas flow control instruction set 328, a gas pressure control instruction set 330, a temperature control instruction set 332, a gas energizer control instruction set 334, and a process monitoring instruction set 336. Typically, the substrate positioning instruction set 326 comprises program code for controlling chamber components that are used to load the substrate 104 onto the support 110 and optionally, to lift the substrate 104 to a desired height in the chamber 106. The gas flow control instruction set 328 comprises program code for controlling the flow rates of different constituents of the process gas. The gas flow control instruction set 328 regulates the opening size of the gas flow control valves 134 to obtain the desired gas flow rate into the chamber 106. The gas pressure control instruction set 330 comprises program code for controlling the pressure in the chamber 106 by regulating open/close position of the throttle valve 150. The temperature control instruction set 332 comprises program code to control temperatures in the chamber 106, such as for example the temperature of a wall 107 in the chamber 106 or the temperature of the substrate 104. The gas energizer control instruction set 334 comprises program code for setting, for example, the RF power level applied to the antenna 156 by the antenna power supply 155.

The process monitoring instruction set 336 may comprise code for monitoring a process in the chamber 106 and determining a process endpoint. For example, the process monitoring instruction set 336 may comprise program code to monitor a cleaning process in the chamber 106 and determining a cleaning endpoint. In one version, the process monitoring instruction set 334 may monitor a cleaning process by receiving a signal from the detector 200 which is related to the intensity of a wavelength of the radiation emitted by the energized cleaning gas in the chamber 106. The signal may be processed to determine the intensity of the signal as a function of time. When the signal intensity reaches a pre-determined value, such as for example a constant value, for a pre-determined length of time, the process monitoring instruction set 334 may give a signal to halt the cleaning process.

In one version, the chamber manager instruction set 324 may set process conditions in the chamber 106 to etch a plurality of batches of substrates 104. For example, the substrate positioning instruction set 326 may position a first substrate 104 to be etched in the chamber 106 and the gas flow instruction set 328 may regulate the flow of etchant gases into the chamber 106 while the gas energizer sets the RF power levels for energizing the etchant. gas. The etching process may also be performed on multiple substrates 104 having different materials with etching process conditions selected by the chamber manager instruction set to etching the different substrates. In one version, the chamber manager instruction set 324 comprises program code to set etching process conditions to etch one or more first substrates 104 comprising a first material, such as for example polysilicon, and thereafter, the chamber manager instruction set 324 comprises program code to etch one or more second substrates 104 comprising a second material, such as for example, silicon oxide.

The chamber manager instruction set 324 may also set process conditions in the chamber to clean the chamber 106 after etching the different substrates 104. For example, the gas flow instruction set 328 may regulate the flow of cleaning gases into the chamber 106, for example by setting a volumetric flow ratio of gases in the cleaning gas, while the gas energizer control instruction set 334 sets the RF power levels for energizing the cleaning gas. The process conditions may be set to clean a number of different types of etchant residue, such as for example silicon containing etchant residues and carbon containing etchant residue, in different distributions in the chamber 106. For example, the gas flow instruction set 328 may include program code to set a volumetric flow ratio of an oxygen containing gas to a fluorocarbon gas of from about 1:1 to about 1:40 to provide good cleaning rates of different types of etchant residues in the chamber 106.

The data signals received by and/or evaluated by the controller 300 may also be sent to a factory automation host computer 338. The factory automation host computer 338 may comprise a host software program 340 that evaluates data from several systems, platforms or chambers 106, and for batches of substrates 104 or over an extended period of time, to identify statistical process control parameters of (i) the processes conducted on the substrates 104, (ii) a property that may vary in a statistical relationship across a single substrate 104, or (iii) a property that may vary in a statistical relationship across a batch of substrates 104. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 104 from the processing sequence, for example, if a substrate property is inadequate or does not fall within a statistically determined range of values, or if a process parameter deviates from an acceptable range; (ii) end processing in a particular chamber 106, or (iii) adjust process conditions upon a determination of an unsuitable property of the substrate 104 or process parameter. The factory automation host computer 338 may also provide the instruction signal at the beginning or end of processing of the substrate 104 in response to evaluation of the data by the host software program 340.

EXAMPLES

The following examples demonstrate chamber cleaning and substrate etching processes according to the present invention. In these examples, batches of substrates were etched in a DPS chamber 106 commercially available from Applied Materials having a process volume of about 35 liters, and which is generally described above.

Example 1

In this example, a first etching process was performed in the chamber 106 on a batch of twenty five substrates 104 comprising a polysilicon layer formed over a silicon oxide layer. The multiple stage etching process was performed to etch the polysilicon layer. The first etching process comprised a main etch stage in which a first etchant gas comprising 70 sccm $Cl_2$, 110 sccm HBr, and 5 to 10 sccm $O_2$, was introduced into the chamber 106; the gas pressure was maintained at 3 to 10 mTorr; and the gas energized by applying an RF power level of 600 to 1000 Watts to the antenna 156 and 40 to 120 Watts to the electrode 178. Thereafter, an overetch stage was performed using an etchant gas comprising 100 sccm HBr and 2 to 5 sccm O2; the pressure of the gases in the chamber 106 was maintained at within 30 to 80 mTorr; and the gas was energized by applying an RF power level of 1000 to 1500 Watts to the antenna 156, and 80 to 150 Watts to the electrode 178.

Following the first etching process, a second etching process was performed in the chamber 106 on a batch of twenty five substrates 104 comprising a polysilicon layer formed over a silicon oxide layer. The multiple stage etching process was performed to etch the polysilicon layer. The second etching process comprised a main etch stage in which a second etchant gas comprising 25 sccm $CF_4$, 110 sccm HBr, 40 sccm $Cl_2$, and 2 sccm $O_2$, was introduced into the chamber 106; the gas pressure was maintained at 4 mTorr; and the gas energized by applying an RF power level of 750 Watts to the antenna 156 and 70 Watts to the electrode 178. Thereafter, an overetch stage was performed using an etchant gas comprising 100 sccm HBr and 2 to 5 sccm O2; the pressure of the gases in the chamber 106 was maintained at within 30 to 80 mTorr; and the gas was energized by applying an RF power level of 1000 to 1500 Watts to the antenna 156, and 80 to 150 Watts to the electrode 178.

Upon completion of the first and second etching process, a cleaning process was performed to clean the chamber 106 of the different types of residues generated in the processes. In the cleaning process, a cleaning gas comprising $O_2$ and $CF_4$ was introduced into the chamber 106. The $O_2$ gas was introduced at a volumetric flow rate equivalent to 20 sccm and the $CF_4$ gas was introduced at a volumetric flow rate equivalent to 100 sccm for a chamber 106 having a process volume of 35 liters, or in other words, in a volumetric flow ratio of $O_2$ to $CF_4$ of 1:5. The gas pressure in the chamber 106 was maintained at 10 mTorr. The cleaning gas was energized by applying an RF power level of 600 Watts to the antenna 156 and a bias power level of 1 Watt to the electrode 178. The intensity of the radiation emission of the energized cleaning gas was monitored at 4405 Å to determine the cleaning process endpoint. The cleaning process provided substantially uniform cleaning of the multiple types of etchant residues, such as carbon and silicon containing etchant residue, generated by the first and second etching process. Thus, this example demonstrates that an energized cleaning gas comprising $O_2$ and $CF_4$ in a volumetric flow ratio of 1:5 may be used to clean the multiple types of etch residue generated in different etching processes.

Example 2

In this example, a first etching process was performed in the chamber 106 on a batch of twenty five substrates 104 comprising silicon. The process was performed to etch shallow trenches on the silicon substrates 104. The first etching process comprised introducing a first etchant gas comprising 100 sccm $Cl_2$, 5 sccm $O_2$ and 7 sccm $N_2$ into the chamber 106; the gas pressure was maintained at 4 mTorr; and the gas energized by applying an RF power level of 1200 Watts to the antenna 156 and 120 Watts to the electrode 178.

Following the first etching process, a second etching process was performed in the chamber 106 on a batch of twenty five substrates 104 comprising polysilicon. The multiple stage etching process was performed to etch the polysilicon material, which formed a layer over a silicon oxide layer. The second etching process comprised a main etch stage in which a second etchant gas comprising 25 sccm $CF_4$, 110 sccm HBr, 40 sccm $Cl_2$, and 2 sccm $O_2$, was introduced into the chamber 106; the gas pressure was maintained at 4 mTorr; and the gas energized by applying an RF power level of 750 Watts to the antenna 156, and 70 Watts to the electrode 178. Thereafter, an overetch stage was performed using an etchant gas comprising 100 sccm HBr and 2 to 5 sccm $O_2$; the pressure of the gases in the chamber 106 was maintained at within 30 to 80 mTorr; and the gas was energized by applying an RF power level of 1000 to 1500 Watts to the antenna 156, and 80 to 150 Watts to the electrode 178.

Upon completion of the first and second etching process, a cleaning process was performed to clean the chamber 106 of the different types of residues generated in the processes. In the cleaning process, a cleaning gas comprising $O_2$ and $CF_4$ was introduced into the chamber 106. The $O_2$ gas was introduced at a volumetric flow rate equivalent to 20 sccm and the $CF_4$ gas was introduced at a volumetric flow rate equivalent to 100 sccm for a chamber 106 having a process volume of 35 liters, or in other words, in a volumetric flow ratio of $O_2$ to $CF_4$ of 1:5. The gas pressure in the chamber 106 was maintained at 10 mTorr. The cleaning gas was energized by applying an RF power level of 600 Watts to the antenna 156 and a bias power level of 1 Watt to the electrode 178. The intensity of the radiation emission of the energized cleaning gas was monitored at 4405 Å to determine the cleaning process endpoint. The cleaning process provided substantially uniform cleaning of the multiple types of etchant residues, such as carbon and silicon containing etchant residue, generated by the first and second etching process. Thus, this example demonstrates that an energized cleaning gas comprising $O_2$ and $CF_4$ in a volumetric flow ratio of 1:5 may be used to clean the multiple types of etch residue generated in different etching processes.

Example 3

In this example, a first etching process was performed in the chamber 106 on a batch of twenty five substrates 104 comprising a first material comprising tungsten silicide. The multiple stage etch process was performed to etch the tungsten silicide material. The first etching process comprised a main etching stage in which a first etchant gas comprising 100 sccm $Cl_2$, 5 sccm $O_2$ and 7 sccm $N_2$ was introduced into the chamber 106; the gas pressure was maintained at 4 mTorr; and the gas energized by applying an RF power level of 1200 Watts to the antenna 156 and 120 Watts to the electrode 178. Thereafter, an overetch stage was performed using an etchant gas comprising 100 sccm HBr and 2 to 5 sccm $O_2$; the pressure of the gases in the chamber 106 was maintained at within 30 to 80 mTorr; and the gas was energized by applying an RF power level of 1000 to 1500 Watts to the antenna 156 and 80 to 150 Watts to the electrode 178.

Following the first etching process, a second etching process was performed in the chamber 106 on a batch of twenty five substrates 104 comprising a second material comprising silicon. The second etching process was performed to etch shallow trenches in the silicon material. The second etching process comprised introducing a second etchant gas comprising 100 sccm $Cl_2$, 5 sccm $O_2$ and 7 sccm $N_2$ into the chamber 106; the gas pressure was maintained at 4 mTorr; and the gas energized by applying an RF power level of 1200 Watts to the antenna 156 and 120 Watts to the electrode 178.

Upon completion of the first and second etching process, a cleaning process was performed to clean the chamber 106 of the different types of residues generated in the processes. In the cleaning process, a cleaning gas comprising $O_2$ and $CF_4$ was introduced into the chamber 106. The $O_2$ gas was introduced at a volumetric flow rate equivalent to 20 sccm and the $CF_4$ gas was introduced at a volumetric flow rate equivalent to 100 sccm for a chamber 106 having a process volume of 35 liters, or in other words, in a volumetric flow ratio of $O_2$ to $CF_4$ of 1:5. The gas pressure in the chamber 106 was maintained at 10 mTorr. The cleaning gas was energized by applying an RF power level of 600 Watts to the antenna 156 and a bias power level of 1 Watt to the electrode 178. The intensity of the radiation emission of the energized cleaning gas was monitored at 4405 Å to determine the cleaning process endpoint. The cleaning process provided substantially uniform cleaning of the multiple types of etchant residues generated by the first and second etching process. Thus, this example demonstrates that an energized cleaning gas comprising $O_2$ and $CF_4$ in a volumetric flow ratio of 1:5 may be used to clean the multiple types of etch residue generated in different etching processes.

Example 4

In this example, a first etching process was performed in the chamber 106 on a batch of twenty five substrates 104 comprising a first material comprising tungsten silicide. The multiple stage etch process was performed to etch the tungsten silicide material. The first etching process comprised a main etching stage in which a first etchant gas comprising 100 sccm $Cl_2$, 5 sccm $O_2$ and 7 sccm $N_2$ was introduced into the chamber 106; the gas pressure was maintained at 4 mTorr; and the gas energized by applying an RF power level of 1200 Watts to the antenna 156 and 120 Watts to the electrode 178. Thereafter, an overetch stage was performed using an etchant gas comprising 100 sccm HBr and 2 to 5 sccm $O_2$; the pressure of the gases in the chamber 106 was maintained at within 30 to 80 mTorr; and the gas was energized by applying an RF power level of 1000 to 1500 Watts to the antenna 156 and 80 to 150 Watts to the electrode 178.

Following the first etching process, a second etching process was performed in the chamber 106 on a batch of twenty five substrates 104 comprising second material comprising polysilicon. The multiple stage etching process was performed to etch the polysilicon material, which formed a layer over a layer of silicon oxide. The second etching process comprised a main etch stage in which a second etchant gas comprising 25 sccm $CF_4$, 110 sccm HBr, 40 sccm $Cl_2$, and 2 sccm $O_2$ was introduced into the chamber 106; the gas pressure was maintained at 4 mTorr; and the gas energized by applying an RF power level of 750 Watts to the antenna 156 and 70 Watts to the electrode 178. Thereafter, an overetch stage was performed using an etchant gas comprising 100 sccm HBr and 2 to 5 sccm $O_2$; the pressure of the gases in the chamber 106 was maintained at within 30 to 80 mTorr; and the gas was energized by applying an RF power level of 1000 to 1500 Watts to the antenna 156 and 80 to 150 Watts to the electrode 178.

Upon completion of the first and second etching process, a cleaning process was performed to clean the chamber 106 of the different types of residues generated in the processes. In the cleaning process, a cleaning gas comprising $O_2$ and $CF_4$ was introduced into the chamber 106. The $O_2$ gas was introduced at a volumetric flow rate equivalent to 20 sccm and the $CF_4$ gas was introduced at a volumetric flow rate equivalent to 100 sccm for a chamber 106 having a process volume of 35 liters, or in other words, in a volumetric flow ratio of $O_2$ to $CF_4$ of 1:5. The gas pressure in the chamber 106 was maintained at 10 mTorr. The cleaning gas was energized by applying an RF power level of 600 Watts to the antenna 156 and a bias power level of 1 Watt to the electrode 178. The intensity of the radiation emission of the energized cleaning gas was monitored at 4405 Å to determine the cleaning process endpoint. The cleaning process provided substantially uniform cleaning of the multiple types of etchant residues, such as carbon and silicon containing residues generated by the first and second etching process. Thus, this example demonstrates that an energized cleaning gas comprising $O_2$ and $CF_4$ in a volumetric flow ratio of 1:5 may be used to clean the multiple types of etch residue generated in different etching processes.

Although exemplary embodiments of the present invention are shown and described, those of ordinary skill in the art may devise other embodiments which incorporate the present invention, and which are also within the scope of the present invention. For example, other substrate etching processes may be performed without deviating from the scope of the present invention. Also, cleaning gas compositions other than those specifically mentioned may be used, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of processing substrates in a chamber, the method comprising:

(a) in a first etching process:

placing a first substrate in the chamber, the first substrate having a first material; and providing a first energized etching gas in the chamber to etch the first material of the first substrate, thereby depositing first etchant residues on surfaces in the chamber, the first etchant residues comprising silicon-containing etchant residues;

(b) in a second etching process:

placing a second substrate in the chamber, the second substrate having a second material; and providing a second energized etching gas in the chamber to etch the second material of the second substrate, thereby depositing second etchant residues on surfaces in the chamber, the second etchant residues comprising carbon-containing etchant residues, wherein the first and second etchant residues have different compositions because either (i) the first material of tho first substrate is a different material than the second material of the second substrate, or (ii) the first energized etching gas comprises a different gas composition than the second energized etching gas; and c) cleaning the first and second etchant residues by (i) introducing a cleaning gas comprising $O_2$ and $CF_4$ into the chamber, the volumetric flow ratio of $O_2$ to $CF_4$ being from about 1:1 to about 1:40, (ii) energizing the cleaning gas, and (iii) exhausting the cleaning gas from the chamber.

2. A method according to claim 1, wherein the first and second materials comprise one or more of silicon, silicon oxide, polycide, polysilicon, tungsten silicide, titanium silicide and photoresist.

3. A method according to claim 1 wherein the volumetric flow ratio of $O_2$ to $CF_4$ is from about 1:2 to about 1:8.

4. A method according to claim 1 wherein (c) comprises applying an RF power level of from about 200 to about 1500 Watts to an antenna about the chamber.

5. A method according to claim 1 wherein (c) comprises applying a bias power level of less than about 40 Watts to an electrode in the chamber.

6. A method according to claim 1 wherein (c) comprises maintaining the pressure in the chamber at from about 5 mTorr to about 40 mTorr.

7. A method according to claim 1 wherein (c) further comprises monitoring an intensity of a radiation emission from the energized gas in the chamber at a wavelength of about 4405 Å to determine a cleaning process endpoint.

8. A method according to claim 1 wherein (a) comprises depositing first etchant residues having a first distribution in the chamber, and wherein (b) comprises depositing second etchant residues having a second distribution in the chamber that is different than the first distribution.

9. A method according to claim 1 comprising processing one or more sacrificial substrates in the chamber after etching of the substrates.

10. A method according to claim 9 comprising providing an energized gas in the chamber to etch the sacrificial substrates and deposit a sacrificial coating on surfaces in the chamber.

11. A method of processing substrates in a chamber, the method comprising:

(a) in a first etching process, etching a first substrate and depositing silicon-containing etchant residues on surfaces in the chamber:

(b) in a second etching process, etching a second substrate and depositing carbon-containing etchant residues on surfaces in the chamber; and (c) cleaning the silicon-containing and carbon-containing etchant residues by (i) introducing a cleaning gas comprising $O_2$ and $CF_4$ into the chamber, the volumetric flow ratio of $O_2$ to $CF_4$ being from about 1:2 to about 1:8, (ii) energizing the cleaning gas, and (iii) exhausting the cleaning gas from the chamber.

12. A method according to claim 11 wherein (c) comprises applying an RF power level of from about 200 to about 1500 Watts to an antenna about the chamber.

13. A method according to claim 11 wherein (c) comprises applying a bias power level of less than about 40 Watts to an electrode in the chamber.

14. A method according to claim 11 wherein (c) comprises maintaining the pressure in the chamber at from about 5 mTorr to about 40 mTorr.

15. A method according to claim 11 wherein (c) further comprising monitoring an intensity of a radiation emission from the energized gas in the chamber at a wavelength of about 4405 Å to determine a cleaning process endpoint.

* * * * *